United States Patent [19]
Loughmiller

[11] Patent Number: 6,140,831
[45] Date of Patent: *Oct. 31, 2000

[54] APPARATUS AND METHODS SELECTIVELY DERIVING A BOOSTED VOLTAGE EXCEEDING AN INTERNAL VOLTAGE

[75] Inventor: Daniel R. Loughmiller, Boise, Id.

[73] Assignee: Micron Technology, Inc., Boise, Id.

[*] Notice: This patent is subject to a terminal disclaimer.

[21] Appl. No.: 08/971,594

[22] Filed: Nov. 17, 1997

Related U.S. Application Data

[63] Continuation of application No. 08/551,825, Nov. 7, 1995, Pat. No. 5,751,158.

[51] Int. Cl.[7] .......................... G01R 31/00; G01R 31/28
[52] U.S. Cl. .......................................... 324/765; 324/763
[58] Field of Search .................................. 324/763, 765, 324/158.1, 73.1; 327/536; 363/59, 60, 61; 326/30; 714/730–733; 438/14, 18; 257/40, 48

[56] References Cited

U.S. PATENT DOCUMENTS

| | | |
|---|---|---|
| 4,621,315 | 11/1986 | Vaughn et al. ........................... 363/60 |
| 4,743,841 | 5/1988 | Takeuchi ................................. 324/73 |
| 4,782,283 | 11/1988 | Zasio ...................................... 324/73 |
| 5,038,325 | 8/1991 | Douglas et al. ................... 365/189.06 |
| 5,043,858 | 8/1991 | Watanabe ................................ 363/61 |
| 5,428,299 | 6/1995 | Koshikawa .............................. 324/763 |
| 5,436,558 | 7/1995 | Saitoh et al. ......................... 324/158.1 |
| 5,457,381 | 10/1995 | Farewell .............................. 324/158.1 |
| 5,469,075 | 11/1995 | Oke et al. .............................. 324/763 |
| 5,471,153 | 11/1995 | Martin .................................... 324/763 |
| 5,537,053 | 7/1996 | Sartwell et al. ........................ 324/763 |
| 5,636,115 | 6/1997 | Drout ....................................... 363/60 |
| 5,656,944 | 8/1997 | Choi ........................................ 324/763 |

*Primary Examiner*—Vinh P. Nguyen
*Attorney, Agent, or Firm*—Schwegman, Lundberg, Woessner & Kluth, P.A.

[57] ABSTRACT

A self-booting test circuit is used in a semiconductor circuit to test an internal voltage of an integrated circuit. The test circuit is connected between a single input pin and single output pin to produce the internal voltage at the output pin in response to a high level voltage being applied to the input pin. The circuit includes two paths, one of which has a delay circuit used to increase the voltage level of a control signal used for gating the internal voltage to the output pin.

11 Claims, 4 Drawing Sheets

APPARATUS AND METHODS SELECTIVELY DERIVING A BOOSTED VOLTAGE EXCEEDING AN INTERNAL VOLTAGE

This application is a continuation of U.S. patent application Ser. No. 08/551,825, filed Nov. 7, 1995, now U.S. Pat. No. 5,751,158.

FIELD OF THE INVENTION

The present invention relates generally to semiconductor devices, such as memory chips. More particularly, the present invention relates to a self-booting test circuit which can be used in a semiconductor device.

BACKGROUND OF THE INVENTION

A semiconductor circuit or logic device may be designed for any of a variety of applications. Typically, the device includes logic circuitry to receive, manipulate and/or store data at an input terminal of the device, and the same or modified data is subsequently generated at an output terminal of the device.

Such devices are typically formed as an integrated circuit (IC) which has one or more commonly used internal operating voltages used by the various elements of the IC. An external source power signal (Vcc) is typically supplied to a power pin of the IC. This Vcc signal is then used to supply power to the circuits internal to the IC. The voltage of the Vcc signal may be reduced to a level appropriate for the circuit as an internal voltage (Vcci). Sometime near the end of the IC manufacturing process, the IC is run through at least one test to verify at least a basic level of conformity to the specifications for the IC. These tests typically involve application of various types of signals using test probes, at the IC's input/output pins.

Conventionally, test circuits are designed into the IC to facilitate an expedited testing process. Previously used test circuits, however, are relatively complex and require that multiple test signals be applied to multiple input pins of the IC.

In connection with the present invention, it has been discovered that such an IC can be designed to provide a stream-lined testing of the IC generally and to validate the IC's processing of one or more of its internal signals.

SUMMARY OF THE INVENTION

Generally, the present invention provides an improved arrangement for testing an internal voltage level of a semiconductor integrated circuit (IC).

In one particular embodiment, the present invention is implemented in the form of a semiconductor circuit for testing an internal voltage of an integrated circuit (IC). The circuit includes an n-channel transistor circuit coupling the internal voltage to an output terminal of the IC. A first circuit is coupled to an input terminal of the IC and includes a first node which is connected to control the n-channel transistor circuit. When a test control signal is applied to the input terminal, the first circuit produces a signal at first voltage level at the first node. The circuit also includes a delay circuit coupled to the input terminal which is capacitively coupled to the first node to boost the first voltage level at the first node to a second voltage level controlling the n-channel transistor circuit to provide the internal voltage to the output terminal.

In another embodiment, the present invention provides a method for testing the internal voltage of an IC. In this embodiment a test control signal is applied to an input terminal of the IC. In response to the test control signal a voltage transition is produced which precharges a control node coupled to control an internal circuit which is connected to provide the internal operating voltage to an output pin of the IC. The voltage level at the control node is boosted to a boosted voltage in response to the voltage transition at a time delayed relative to the precharging of the control node. In response to the boosted voltage being applied to the control node, the internal voltage is supplied to the output terminal.

The above summary of the present invention is not intended to present each embodiment or every aspect of the present invention. Rather, the invention will be understood by reference to the figures and the associated description which follow.

BRIEF DESCRIPTION OF THE DRAWINGS

Other aspects and advantages of the present invention will become apparent upon reading the following detailed description and upon reference to the drawings in which.

Figure 1:
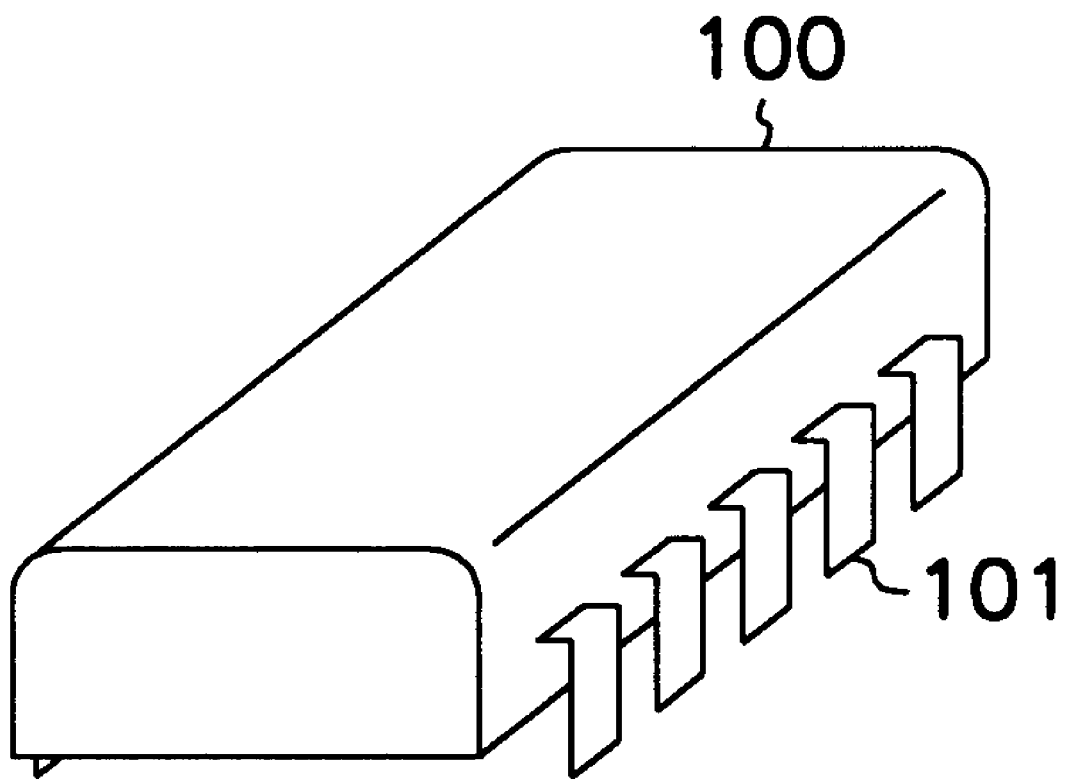
FIG. 1 is a semiconductor package incorporating circuitry in accordance with the principles of the present invention.

While the invention is susceptible to various modifications and alterative forms, specifics thereof have been shown by way of example in the drawings and will be described in detail. It should be understood, however, that the intention is not to limit the invention to the particular embodiment described. On the contrary, the intention is to cover all modifications, equivalents, and alternatives falling within the spirit and scope of the invention as defined by the appended claims.

DETAILED DESCRIPTION OF THE DRAWINGS

The present invention has a variety of applications in semiconductor circuits requiring or benefiting from a determination that one or more internal voltages of the device are operating properly. The present invention has been found to be particularly advantageous when used in connection with more complex with integrated circuit packages such as dynamic memory chips, microcomputers, and the like. Semiconductor circuitry of this type is often packaged as illustrated in FIG. 1 by reference numeral 100. The semiconductor package of FIG. 1 has a number of pins 101 used to connect the internal components of the package to other devices.

Figure 2:
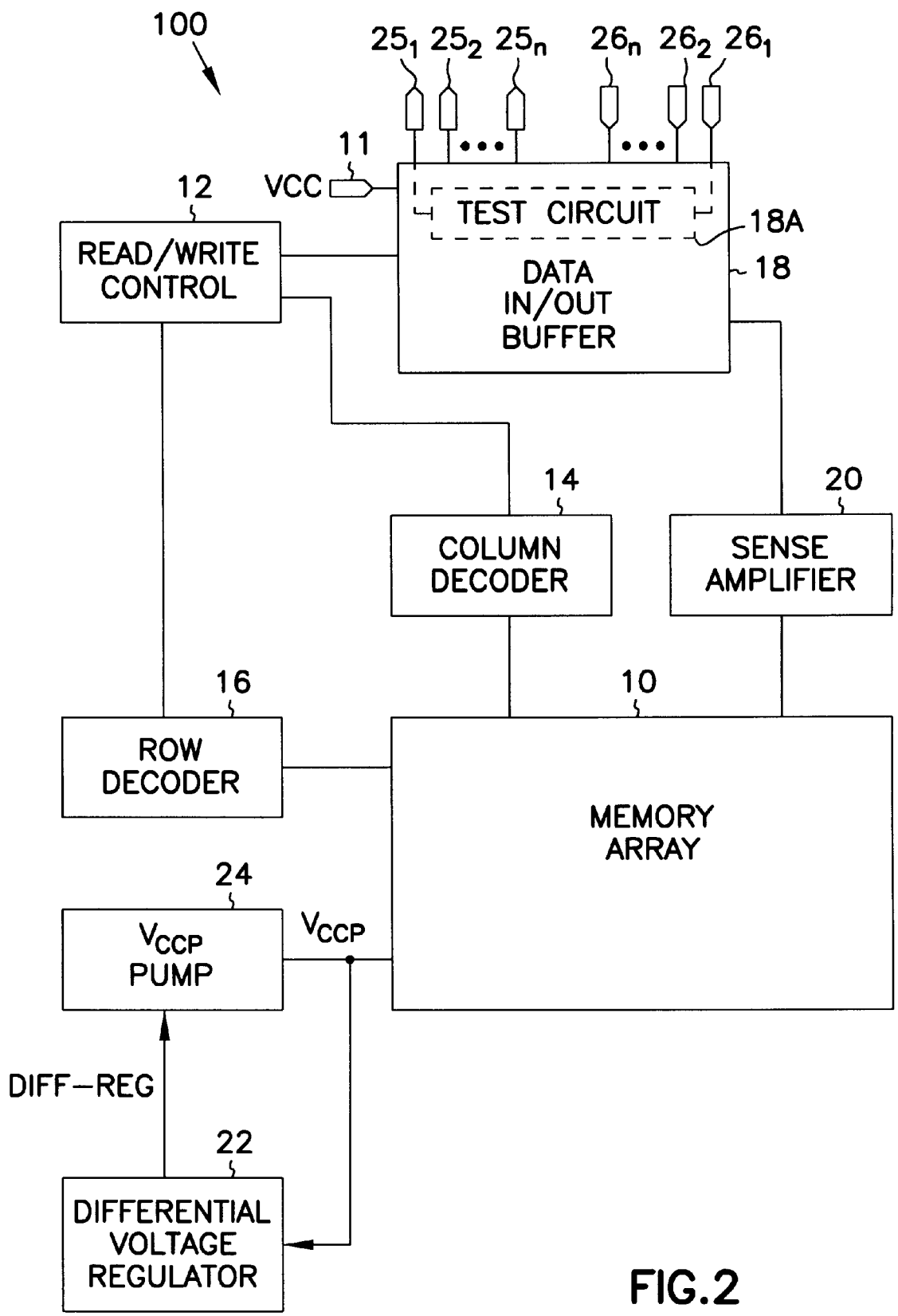
FIG. 2 is block diagram of a DRAM exemplifying a semiconductor device incorporating the principles of the present invention.

FIG. 2 illustrates an exploded view of such a semiconductor package 100, exemplified in block diagram form as a DRAM circuit. In FIG. 2, a conventional power supply (not shown) provides regulated power signals (e.g., Vcc) to an input pin 11 of the DRAM circuit. The power signal Vcc is typically converted to an internal operating voltage Vcci. As used herein, however, the internal operating voltage Vcci, refers to any known internal voltage of the IC responsive to a control signal at any input pin of the IC and which is tested by the test circuit of the present invention. The internal operating voltage Vcci is used by the various circuits of the DRAM, including a memory array 10, read/write control circuitry 12, a row decoder 16, column decoder 14 a sense amplifier 20, all of which are conventionally known. A differential voltage regulator 22 and Vccp pump circuit 24 provide a regulated Vccp to the memory array 10.

Data in/out buffer circuitry 18 are used during normal operations to provide an interface for the data between the selected memory cell and external data input/output pins 26 and 25, respectively. The data in/out buffer 18 includes conventional input and output logic circuitry. For additional information regarding the general operation of the conventional circuits in the block diagram of FIG. 2, reference may be made to U.S. Pat. No. 5,335,202, which issued on Aug. 2, 1994.

A self-booting test circuit 18A, in accordance with the present invention, has been incorporated as part of the data in/out buffer 18. The data in/out buffer 18 includes a number of output pins $25_1, 25_2, \ldots 25_n$, and a number of input pins $26_1, 26_2, \ldots 26_n$ of the integrated circuit. As described more fully below, the test circuit 18A is provided to test the internal operating voltage Vcci by applying a test signal to one of the input pins 26. The test circuit is connected between any one of the input pins 26 and any one of the output pins 25. In operation, when a test control voltage is applied to the input pin 26 (connected to the test circuit 18A), the internal operating voltage Vcci which is to be tested by the test circuit 18A is supplied to the output pin 25.

It is noted that the input pin 26 and the output pin 25 are also used by the data in/out buffer 18 in the conventional manner. In other words, dedicated input and output pins are not required for the test circuit.

Figure 3:
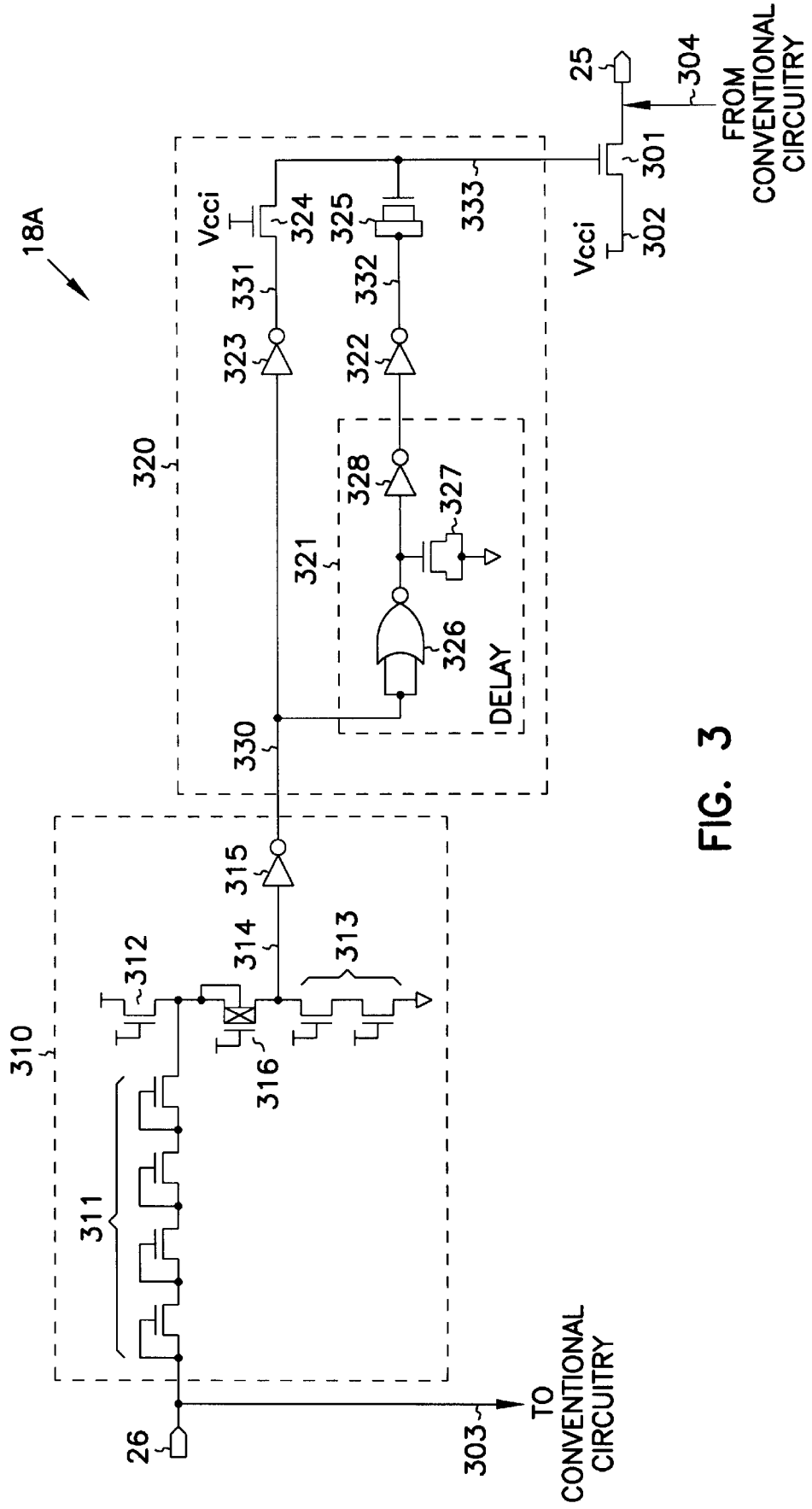
FIG. 3 is a schematic diagram of an exemplary embodiment of a test circuit implemented in accordance with the principles of the present invention.

As illustrated in FIG. 3, the test circuit 18A uses an n-channel transistor 301 to supply an internal IC voltage Vcci 302 to the output pin 25. The test circuit 18A controls the voltage supplied to the gate of n-channel transistor 301 using a supervolt input detect circuit 310, which is conventional, and a voltage boosting circuit 320.

The input pin 26 is connected to conventional circuitry as described in connection with FIG. 2 via line 303. In the embodiment illustrated, the input buffer logic of the data in/out buffer 18 connects to pin 26 and the output buffer logic connects to the output pin 25 via line 304.

The supervolt input detect circuit 310 is connected to the input pin 26, to detect the presence of a test control signal applied to the input pin 26. As described more fully below, in the absence of the test control signal, the voltage boost circuit 320 is disabled. This disable mode occurs when the signal provided to the gate of n-channel transistor 301 is at a low logical level and the voltage on the output pin 25 is not influenced by the test circuit 18A. Thus, when the voltage of the signal at lead 330 provided from the supervolt input detect circuit 310 to the voltage boosting circuit 320 is logically high, the circuit 18A has no affect.

Under normal operation, the voltage level provided at the input pin 26 is relatively low (e.g., 5 volts or less), and the supervolt input detect circuit 310 maintains the disabled mode. The supervolt input detect circuit 310 includes a number of n-channel transistors 311 configured as diodes, collectively providing a fixed voltage drop. The circuit also includes n-channel transistors 312 and 313 and a p-channel transistor 316 configured to provide an additional fixed voltage drop. These elements operate to reduce the voltage applied to the input pin 26 such that the voltage at node 314 is below a predefined threshold. An invertor 315 is connected to node 314 of the circuit. When the voltage applied to the input pin 26 is reduced by the circuit to a value below a threshold bf invertor 315 (e.g., under normal operating conditions), the invertor 315 outputs a logic high voltage level as the signal at lead 330.

When a test operation is carried out, a supervoltage (e.g., 10 volts) is applied to the input pin 26 as a test control signal. In response to the test control signal, the voltage at node 314 rises above the threshold of invertor 315. Consequently, the voltage level of the output signal at lead 330 transitions from high to low. This operation occurs automatically as the test control circuit is applied to the input pin 26 (i.e., the test circuit is self-booting).

The voltage boosting circuit 320 produces a boosted output voltage at node 333 in response to the high to low transition of the signal at lead 330. The boosted output voltage at node 333, which is coupled to the gate of the n-channel transistor 301, is sufficient to allow Vcci 302 to flow through the n-channel transistor 301 to the output pin 25 for verification by the test equipment. In order for Vcci to be to be supplied to the output pin 25, the voltage supplied to the control gate of n-channel transistor 301 must be a Vt higher than Vcci.

As described below, the voltage boosting circuit 320 operates to provide a voltage level nearly 2 times Vcci to the control gate of transistor 301, which is a level sufficient to pass the entire voltage of Vcci to the output pin 25. This is accomplished using two paths; a fast path including an n-channel transistor 324 which acts as a switch to pass the signal at node 331 to node 333 to precharge node 333; and a slow (or delayed) path which includes a delay circuit 321 to pass essentially the same signal, slightly delayed to a capacitor which couples to the node 333. After node 333 is precharged, the n-channel transistor 324 isolates node 333 to maintain the charge at the node 333.

More specifically, in the fast path, an invertor 323 is coupled to the supervolt input detect circuit 310 to receive the signal at node 330 and produce the inversion of this signal at node 331. The n-channel transistor 324 passes the voltage at node 331 to node 333 with a voltage drop Vt corresponding to the transistor 324. Node 333 is connected to the gate of the n-channel transistor 301.

In the slow path, the delay circuit 321 is also coupled to the supervolt input detect circuit 310 to receive the signal at lead 330. As the input signal 330 transitions, the signal is also inverted by inverting element 326 of the delay circuit 321. Thus, a high level voltage signal is output from the inverting element 326. The high level voltage signal charges an n-channel transistor configured as a capacitor 327. The charge time of capacitor 327 defines the delay of the delay circuit 321. Once the capacitor 327 is charged sufficiently, the invertor 328 inverts the signal to a low logic level which is provided to invertor 322. The output voltage from invertor 322 is provided to node 332 which is coupled to node 333 via an n-channel transistor configured as a capacitor 325.

The charging of capacitor 327 causes invertor 322 to produce a high level voltage signal at node 332. Because the voltage at node 333 is already at a Vt below Vcci by this time, the instantaneous change at node 332 forces an effective increase of the voltage at node 333. Prior to the inversion of the signal by invertor 322, the potential difference between nodes 332 and 333 on respective sides of the capacitor element 325 is approximately Vcin–Vt (Vcin being the voltage of the signal 330 and Vt being the voltage drop across the transistor 324). Upon the inversion of the signal value at node 332, the voltage at 333 increases to a value of approximately 2 Vcc–Vt (e.g., approximately 6.4 volts) to maintain the potential difference across the capacitor 325. The transistor 324 is then immediately and automatically biased to a non-connecting mode.

Figure 4A:
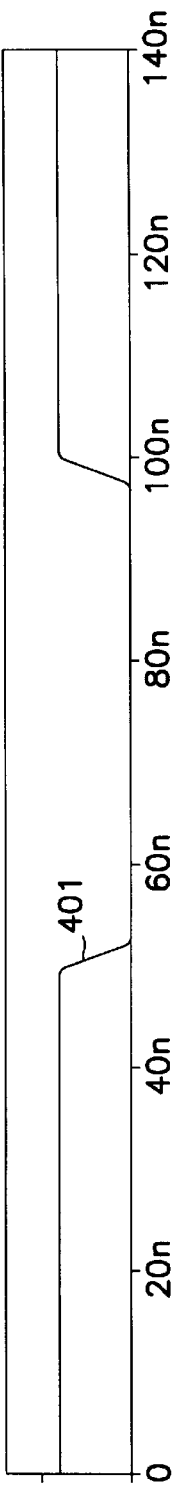
FIGS. 4A–4D depicting relative voltage changes in the circuit of FIG. 3 during operation of the test circuit in accordance with the principles of the present invention.
Figure 4B:
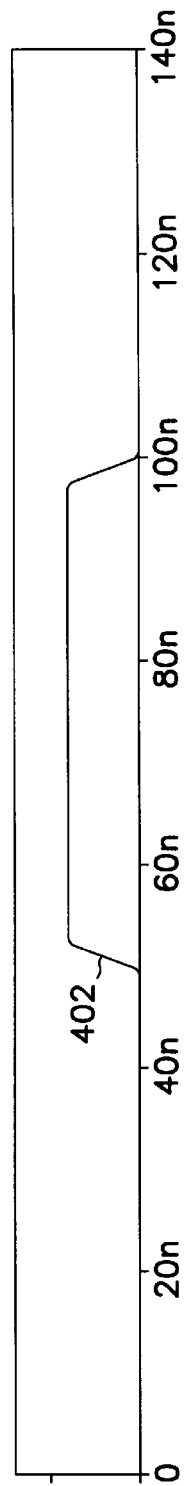
Figure 4C:
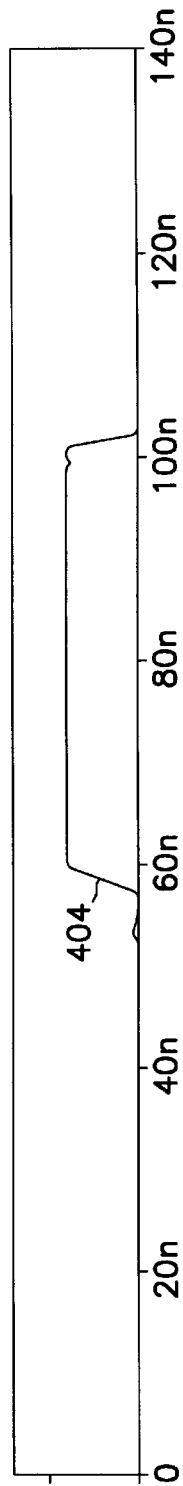
Figure 4D:
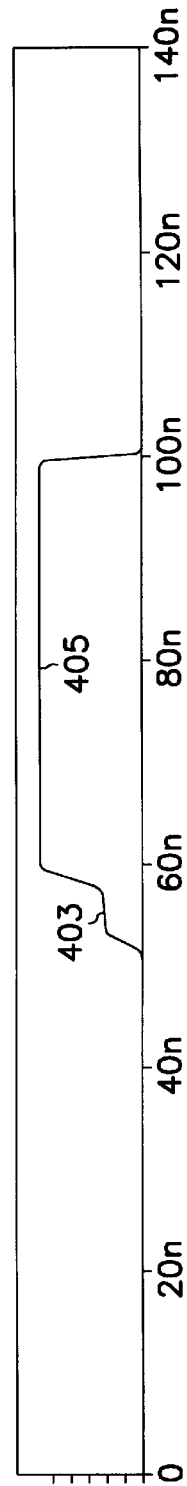

The above described operation of the voltage boosting circuit 320 as the input signal 330 transitions from a high level to a low level is illustrated in FIGS. 4A–4D. Specifically, FIG. 4A depicts the voltage level of signal 330. FIG. 4B illustrates the voltage level at node 331. The voltage level at node 332 is illustrated in FIG. 4C, and FIG. 4D illustrates the voltage level at node 333.

As illustrated in FIGS. 4A–4C, as the input signal 330 transitions at point 401 from a high voltage value (e.g., 3.6 volts) to a low level value (e.g., 0.0 volts), the voltage at node 331 is inverted to a high level 402 (e.g., 3.6 volts) by invertor 323. This precharges the voltage level at node 333 (i.e., increases the voltage at node 333 to a high level 403 equal to the voltage at node 331 less the voltage drop Vt across the transistor 324). As the voltage at node 332 increases to a high level 404, the capacitive coupling of node 332 to node 333 boosts the voltage at node 333 to a boosted voltage level 405.

In the manner described above, a boosted voltage at approximately 2 Vcc–Vt is supplied to the gate of the n-channel transistor 301 which activates to provide Vcci to the output pin 25 of the data in/out buffer 18.

The foregoing description, which has been disclosed by way of the above examples and discussion, addresses embodiments of the present invention encompassing the principles of the present invention. The embodiments may be changed, modified and/or implemented using various circuit types and arrangements. For example, Vcci can be any internal voltage of the IC responsive to an input voltage being applied to a pin. Moreover, the test circuit can be similarly integrated into any integrated circuit where the test function is desired. Those skilled in the art will readily recognize that these and various other modifications and changes may be made to the present invention without strictly following the exemplary embodiments and applications illustrated and described herein, and without departing from the true spirit and scope of the present invention which is set forth in the following claims.

What is claimed is:

1. A method, comprising:

detecting a test control signal at an input pin of an integrated circuit;

charging a first node of a first capacitor in response to the detected test control signal; and charging a second node of the first capacitor after a predetermined period of time following the charging of the first node to produce an increased voltage level on the first node of the first capacitor.

2. The method of claim 1, further comprising;

using the increased voltage level on the first node to couple an internal voltage of the integrated circuit to an output pin of the integrated circuit in order to measure the internal voltage.

3. The method of claim 1, wherein the predetermined period of time corresponds to a charge time of a second capacitor.

4. The method of claim 3, wherein the second capacitor is coupled to an invertor, and wherein the charge time includes the amount of time necessary to charge the second capacitor above a threshold voltage for activating the invertor.

5. A method of testing an internal voltage of an integrated circuit, comprising:

detecting a test control signal at an input pin;

charging a first node of a first capacitor in response to the detected test control signal;

charging a second node of the first capacitor after a predetermined period of time following the charging of the first node to produce an increased voltage level on the first node of the first capacitor; and using the increased voltage level on the first node to couple the internal voltage to an output pin.

6. The method of claim 5, wherein using the increased voltage level on the first node to couple the internal voltage to an output pin comprises applying the increased voltage level to a gate of an n-channel transistor to allow the internal voltage to flow through the n-channel transistor to the output pin.

7. A method of testing an internal voltage of an integrated circuit, comprising:

detecting a test control signal at an input pin;

charging a first node of a first capacitor in response to the detected test control signal;

charging a second node of the first capacitor after a predetermined period of time following the charging of the first node to produce an increased voltage level on the first node of the first capacitor, wherein the predetermined period of time corresponds to a charge time of a second capacitor; and using the increased voltage level on the first node to couple the internal voltage to an output pin.

8. The method of claim 7, wherein the predetermined period of time corresponds to an amount of time necessary to charge the second capacitor above a threshold voltage for activating an invertor coupled to the second capacitor.

9. A method of testing an internal voltage of an integrated circuit, comprising:

detecting a test control signal at an input pin;

charging a first node of a first capacitor in response to the detected test control signal;

charging a second node of the first capacitor after a predetermined period of time following the charging of the first node to produce an increased voltage level on the first node of the first capacitor, wherein the predetermined period of time corresponds to an amount of time necessary to charge a second capacitor above a threshold voltage for activating an invertor coupled to the second capacitor; and using the increased voltage level on the first node to couple the internal voltage to an output pin.

10. A method of testing an internal voltage of an integrated circuit, comprising:

detecting a test control signal at an input pin;

charging a first node of a first capacitor in response to the detected test control signal;

delaying for a predetermined period of time following the charging the first node of the first capacitor, wherein the predetermined period of time is an amount of time necessary to charge a second capacitor above a threshold voltage for activating an invertor coupled to the second capacitor;

charging a second node of the first capacitor, subsequent to activating the invertor coupled to the second capacitor, to produce an increased voltage level on the first node of the first capacitor; and using the increased voltage level on the first node to couple the internal voltage to an output pin.

11. A method of testing an internal voltage of an integrated circuit, comprising:

detecting a test control signal at an input pin;

charging a first node of a first capacitor in response to the detected test control signal;

charging a second node of the first capacitor after a predetermined period of time following the charging of the first node to produce an increased voltage level on the first node of the first capacitor;

applying the increased voltage level to a gate of an n-channel transistor; and applying the internal voltage to the output pin through the transistor in response to the increased voltage level applied to the gate of the n-channel transistor.

* * * * *

UNITED STATES PATENT AND TRADEMARK OFFICE
CERTIFICATE OF CORRECTION

PATENT NO.: 6,140,831

DATED: Oct. 31, 2000

INVENTOR(S): Loughmiller

It is certified that error appears in the above-identified patent and that said Letters Patent is hereby corrected as shown below:

On the cover page, please delete title "APPARATUS AND METHODS SELECTIVELY DERIVING A BOOSTED VOLTAGE EXCEEDING AN INTERNAL VOLTAGE" and insert -- METHODS OF TESTING AN IC INTERNAL VOLTAGE--, therefor.

In column 1, line 1, delete "APPARATUS AND METHODS SELECTIVELY DERIVING A BOOSTED VOLTAGE EXCEEDING AN INTERNAL VOLTAGE" and insert --METHODS OF TESTING AN IC INTERNAL VOLTAGE--, therefor.

Signed and Sealed this

Twenty-ninth Day of May, 2001

*Attest:*

NICHOLAS P. GODICI

*Attesting Officer*    *Acting Director of the United States Patent and Trademark Office*